United States Patent
Hoang et al.

(10) Patent No.: US 11,190,158 B2
(45) Date of Patent: Nov. 30, 2021

(54) LOW FREQUENCY SHIELD SOLUTIONS WITH SPUTTERED/SPRAYED ABSORBER MATERIALS AND/OR ABSORBER MATERIALS MIXED IN MOLD COMPOUND

(71) Applicant: SKYWORKS SOLUTIONS, INC., Irvine, CA (US)

(72) Inventors: Dinhphuoc Vu Hoang, Anaheim, CA (US); Robert Francis Darveaux, Corona Del Mar, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 73 days.

(21) Appl. No.: 16/576,945

(22) Filed: Sep. 20, 2019

(65) Prior Publication Data

US 2020/0099356 A1   Mar. 26, 2020

Related U.S. Application Data

(60) Provisional application No. 62/734,640, filed on Sep. 21, 2018.

(51) Int. Cl.
| | |
|---|---|
| *H03H 1/00* | (2006.01) |
| *H05K 9/00* | (2006.01) |
| *H03H 3/00* | (2006.01) |
| *B29C 70/68* | (2006.01) |
| *H01F 1/11* | (2006.01) |
| *B29L 31/34* | (2006.01) |

(52) U.S. Cl.
CPC .......... *H03H 1/0007* (2013.01); *B29C 70/68* (2013.01); *H01F 1/11* (2013.01); *H03H 3/00* (2013.01); *H05K 9/0045* (2013.01); *H05K 9/0047* (2013.01); *H05K 9/0088* (2013.01); *B29K 2995/0011* (2013.01); *B29L 2031/3481* (2013.01); *H03H 2001/0021* (2013.01)

(58) Field of Classification Search
CPC ........ H03H 1/0007; H03H 3/00; B29C 70/68; H01F 1/11; H05K 9/0045; H05K 9/0047; H05K 9/0088

See application file for complete search history.

(56) References Cited

U.S. PATENT DOCUMENTS

| | | | |
|---|---|---|---|
| 7,315,248 B2 * | 1/2008 | Egbert | G06K 19/07749 |
| | | | 235/488 |
| 9,472,514 B2 | 10/2016 | Sun et al. | |

(Continued)

FOREIGN PATENT DOCUMENTS

| | | |
|---|---|---|
| JP | 2013243571 A | 12/2013 |
| KR | 10-2006-0041225 A | 5/2006 |

OTHER PUBLICATIONS

International Search Report and Written Opinion from corresponding International Application No. PCT/US2019/052064 dated Jan. 10, 2020.

(Continued)

*Primary Examiner* — Robert J Pascal
*Assistant Examiner* — Kimberly E Glenn
(74) *Attorney, Agent, or Firm* — Lando & Anastasi, LLP

(57) ABSTRACT

An electronic device includes an electromagnetic interference shield having a layer of conductive material covering at least a portion of the electronic device and having a skin depth of less than 2 μm for electromagnetic signals having frequencies in a kilohertz range.

33 Claims, 4 Drawing Sheets

(56) References Cited

U.S. PATENT DOCUMENTS

| | | | |
|---|---|---|---|
| 2008/0012103 A1 | 1/2008 | Foster et al. | |
| 2012/0236528 A1* | 9/2012 | Le | H05K 9/0088 |
| | | | 361/818 |
| 2013/0313446 A1 | 11/2013 | Yamazaki | |
| 2015/0076670 A1 | 3/2015 | Pan et al. | |

OTHER PUBLICATIONS

"Magnetic shielding film MCF5" Data Sheet on thin film MCF5: Composition: Co69, Fe4, Mo4, Nb1, Si16, B7, <https://www.emrss.com/products/magnetic-shielding-film-mcf5> [retrieved from the Internet on Dec. 20, 2019].

Duffy et al., "Investigating the scope for electroplated magnetic alloys in shielding of PCBs", Power Electronics Research Centre, National University of Ireland Galway, Galway, Ireland (2012), pp. 401-406.

Sitaraman et al., "Modeling, Design and Demonstration of Integrated Electromagnetic Shielding for Miniaturized RF SOP Glass Packages", 3D Systems Packaging Research Center, Georgia Institute of Technology, Atlanta, GA, Electronic Components & Technology Conference (2015), pp. 1956-1960.

Kuo et al., "Shielding Effectiveness Modeling and Measurement of Multiple Layers Conformal Shielding on System-in-Package (SiP) Module", Department of Electrical Engineering, National Sun Yat-sen University, Kaohsiung, 804, Taiwan, Electrical Laboratory, Corporate R&D, Advanced Semiconductor Engineering (ASE), Inc. Kaohsiung, 811, Taiwan, International Microsystems, Packaging, Assembly and Circuits Technology Conference, pp. 370-373, 2016.

\* cited by examiner

LOW FREQUENCY SHIELD SOLUTIONS WITH SPUTTERED/SPRAYED ABSORBER MATERIALS AND/OR ABSORBER MATERIALS MIXED IN MOLD COMPOUND

CROSS-REFERENCE TO RELATED APPLICATIONS

This application claims priority under 35 U.S.C. § 119(e) to U.S. Provisional Patent Application Ser. No. 62/734,640, titled "LOW FREQUENCY SHIELD SOLUTIONS WITH SPUTTERED/SPRAYED ABSORBER MATERIALS AND/OR ABSORBER MATERIALS MIXED IN MOLD COMPOUND," filed Sep. 21, 2018, which is incorporated herein in its entirety for all purposes.

BACKGROUND

Technical Field

Embodiments of this disclosure relate to multi-component microelectronic devices and structures and methods of mitigating electromagnetic cross-talk in same.

Description of Related Technology

Modern electronic devices may include modules or packages housing multiple components, for example, power amplifiers, low noise amplifiers, voltage-controlled oscillators, switches, filters, and other components that operate utilizing alternating current. Market forces continue to demand electronic devices having increasingly smaller form factors and that are lighter and less expensive, but have greater functionality, for example, in electronic communication devices, the ability to support multiple frequency bands. As a result, the circuit density in many electronic devices continues to become greater with each new product iteration. Electromagnetic interference (EMI) or cross-talk between the components in a common electronic device module or between components in an electronic device module and external sources may degrade overall performance or cause failure of an electronic device.

SUMMARY

In accordance with one aspect, there is provided an electronic device. The electronic device comprises an electromagnetic interference shield including a layer of conductive material covering at least a portion of the electronic device and having a skin depth of less than 2 μm for electromagnetic signals having frequencies in a kilohertz range.

In some embodiments, the electronic device is covered in a molding material and the electromagnetic interference shield is disposed on the molding material. The molding material may include a filler material that retards propagation of electromagnetic signals. The filler material may have a skin depth of less than 2 μm for electromagnetic signals having frequencies in the kilohertz range. The filler material may include a magnetic ceramic ferrite. The filler material may include an iron containing alloy. The filler material may be non-conductive. The filler material may include conductive particles surrounded by non-conductive material.

In some embodiments, a component of the electronic device is configured to emit an electromagnetic signal at a frequency within one or more of a hertz range, a kilohertz range, or a megahertz range.

In some embodiments, the layer of conductive material includes a magnetic ceramic ferrite.

In some embodiments, the layer of conductive material includes an iron containing alloy.

In some embodiments, the layer of conductive material has a thickness of less than 30 μm. The layer of conductive material may have a thickness of less than 20 μm.

In some embodiments, the electronic device further comprises a radio frequency filter. The electronic device may be included in an electronics module.

In accordance with another aspect, there is provided and electronic device. The electronic device comprises a molding material covering at least a portion of the electronic device and including a filler material having a skin depth of less than 2 μm for electromagnetic signals having frequencies in a kilohertz range.

In some embodiments, the filler material includes a magnetic ceramic ferrite.

In some embodiments, the filler material includes an iron containing alloy.

In some embodiments, the filler material is non-conductive.

In some embodiments, the filler material includes conductive particles covered by non-conductive material.

In some embodiments, a component of the electronic device is configured to emit an electromagnetic signal at a frequency within one or more of a hertz range, a kilohertz range, or a megahertz range.

In some embodiments, the electronic device further comprises an electromagnetic interference shield including a layer of conductive material having a skin depth of less than 2 μm for electromagnetic signals having frequencies in a kilohertz range disposed on the molding material. The layer of conductive material may include a magnetic ceramic ferrite. The layer of conductive material may include an iron containing alloy. The layer of conductive material may have a thickness of less than 30 μm. The layer of conductive material may have a thickness of less than 20 μm.

In some embodiments, the electronic device further comprises a radio frequency filter. The electronic device may be included in an electronics module.

In accordance with another aspect, there is provided a method of forming an electromagnetic interference shield on an electronic device. The method comprises depositing a molding material including a filler material having a skin depth of less than 2 μm for electromagnetic signals having frequencies in a kilohertz range on a surface of the electronic device.

In some embodiments, the method further comprises depositing a layer of conductive material having a skin depth of less than 2 μm for electromagnetic signals having frequencies in the kilohertz range on the molding material.

In accordance with another aspect, there is provided a method of forming an electromagnetic interference shield on an electronic device. The method comprises depositing a molding material on a surface of the electronic device; and depositing a layer of conductive material having a skin depth of less than 2 μm for electromagnetic signals having frequencies in a kilohertz range on the molding material.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1B:
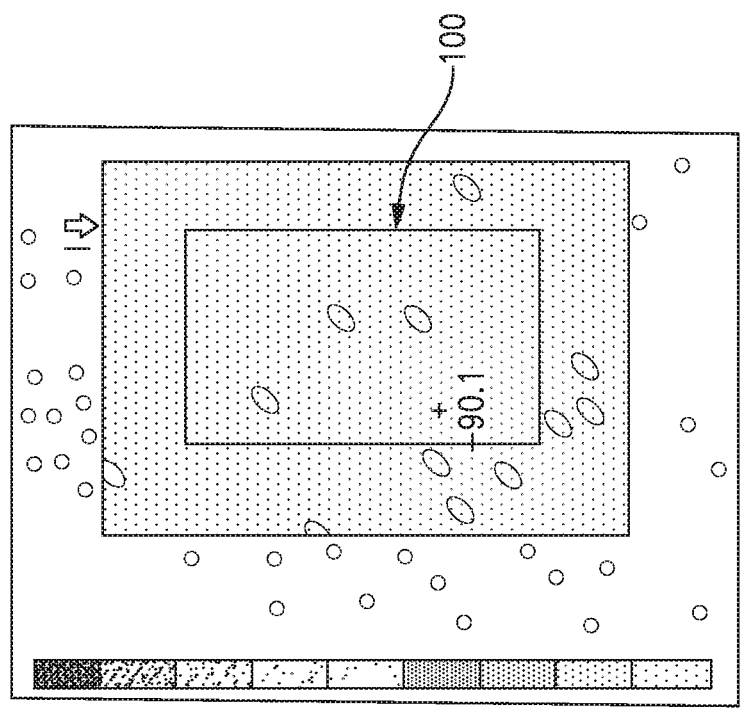
FIG. 1B is an illustration of suppression of EMI from a power amplifier module using a second type of shielding.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Modern electronic devices, for example, communications devices such as cellular telephones may include multiple components that operate at frequencies in the GHz range. Electromagnetic shielding for devices operating at frequencies in the GHz range may be accomplished using films or layers of conductive material disposed between devices one wishes to electromagnetically isolate from one another to prevent cross-talk. At such high frequencies, electromagnetic signals do not penetrate deeply into layers of conductive material, so electromagnetic shielding between devices operating at frequencies in the GHz range may be accomplished using thin films of conductive material, for example, metal films with thicknesses of 3 µm or less. At lower frequencies, for example, in the MHz, kHz, or Hz ranges electromagnetic signals propagate more deeply into layers of conductive material than do signals at frequencies in the GHz range. Shielding that may be useful for isolating devices operating in the GHz range may thus be inadequate for electromagnetically isolating devices operating at low frequencies—electromagnetic signals generated by components operating at low frequencies may pass through shielding designed to suppress cross-talk between devices operating at frequencies in the GHz range and may cause interference or cross-talk between other nearby devices. The degree to which electromagnetic signals penetrate into a conductor may be referred to as electromagnetic "skin depth." The skin depth is a measure of the depth at which the intensity of electromagnetic radiation in a conductor falls to 1/e of its value near the surface of the conductor and is dependent on the frequency of the electromagnetic signal and material properties of the conductive material. One formula for skin depth δ is:

$$\delta = \sqrt{\frac{\rho}{\mu * f * \pi}}$$

where ρ is resistivity (µΩ·cm) of the conductive material, f is frequency (MHz), and µ is permeability of the conductive material The skin depth of copper, silver, and nickel at various frequencies is illustrated in Table 1 below:

TABLE 1

| Selected Material Skin Depths (µm) | | | |
|---|---|---|---|
| Frequency | Copper | Silver | Nickel |
| 100 kHz | 206.2 | 200.5 | 17.0 |
| 5 MHz | 29.1 | 28.3 | 2.4 |
| 100 MHz | 6.52 | 6.34 | 0.53 |
| 500 MHz | 2.93 | 2.87 | 0.42 |
| 1 GHz | 2.07 | 2.03 | 0.30 |
| 2 GHz | 1.46 | 1.44 | 0.21 |
| 5 GHz | 0.93 | 0.91 | 0.13 |
| 10 GHz | 0.65 | 0.64 | 0.09 |
| 100 GHz | 0.21 | 0.20 | 0.03 |

As can be seen in Table 1 above, a film of copper of only a few microns in thickness may be sufficient to shield an electronic component against electromagnetic interference at frequencies in the GHz range, but to shield the component against electromagnetic interference at frequencies in the kHz range, the copper film should be a few hundreds of microns thick. Such thick shielding would typically not be practical or cost effective in typical electronic device fabrication processes.

One option for providing thin shielding against electromagnetic interference for EMI-sensitive devices is to utilize an EMI absorber material that has a higher permeability and is a better absorber of electromagnetic energy than copper, silver, or nickel. Such materials may include magnetic ceramic ferrites or iron containing alloys, for example, NiFe, CuNiFe/CZT (CZT=cadmium zinc telluride. For high frequency implementation in the GHZ range Cu may make up the majority of the material. For low frequency implementation or implementations in the kHz range NiFe may make up the majority of the material) or MCFS magnetic shielding film, available from EMR Shielding solutions and having a formula $Co_{69}Fe_4Mo_4NbSi_{16}B_7$. A film of one or more of these materials may be deposited, for example, by sputtering, spraying, or printing on a packaged device or module before or after mounting the packaged device or module onto a carrier, for example, a printed circuit board. The deposited film thickness may range between about 5 µm and about 30 µm, or in some embodiments between 0 µm and about 20 µm. The EMI absorber material may have a skin depth of less than 3 µm, less than 2 µm, less than 1 µm, less than 0.5 µm, or less than 0.1 µm, for electromagnetic signals in the GHz range (1 GHz to 1,000 GHz), the MHz range (1 MHz to 1 GHz), the kHz range (1 kHz to 1 MHz), or the Hz range (1 Hz to 1 kHz) or skin depths less than that of copper, silver, or nickel at the respective frequencies illustrated in Table 1.

Figure 1A:
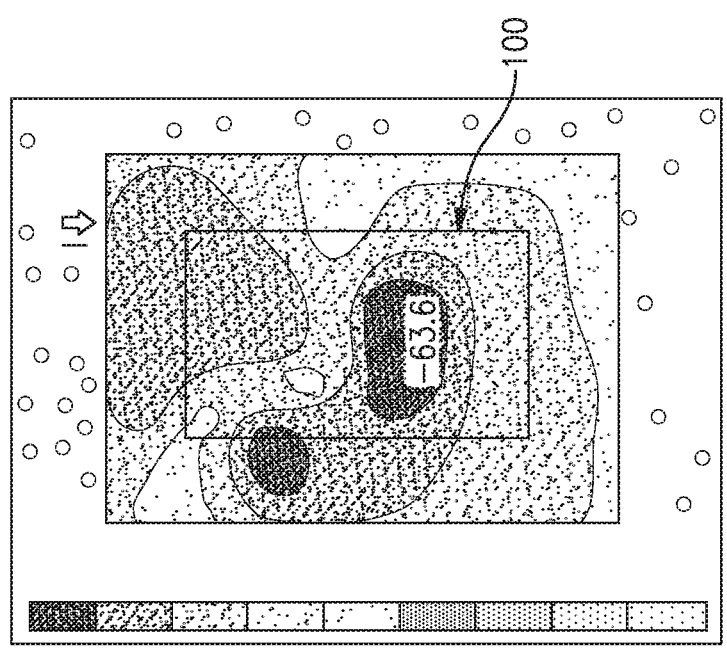
FIG. 1A is an illustration of suppression of electromagnetic interference (EMI) from a power amplifier module using a first type of shielding.

FIGS. 1A and 1B compare the effect of suppression of EMI from a power amplifier module (Skyworks Solutions, Inc. model SKY78140-22) operating at 127.7 kHz utilizing a 3 µm thick conformally deposited copper film vs. the same copper film covered device with an additional 20 µm thick film of MCFS placed over the device, respectively. In FIGS. 1A and 1B the location of the device beneath the respective films is indicated by the outline 100. The Cu film suppressed EMI from the device by 63.6 dBm, while the Cu film with the additional MCFS film suppressed the EMI from the device by 90.1 dBm, a 26.5 dBm improvement.

Figure 2:
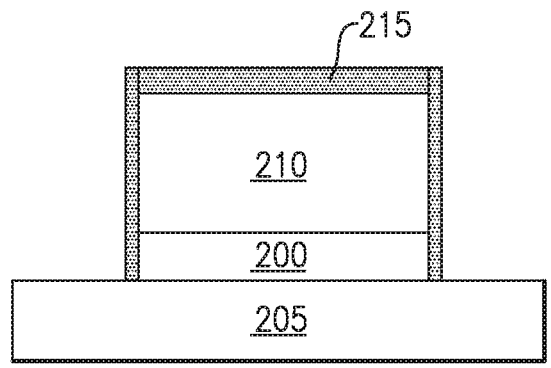
FIG. 2 illustrates an electronic device module including a first type of EMI shielding.

FIG. 2 schematically illustrates an electronic device, for example, a multi-chip module 200 disposed on a circuit board 205, covered by a molding material 210 and further covered by a layer of highly absorbing EMI shield material 215 that has been deposited by, for example, sputtering or spraying. The molding material 210 may be or may include any typical electronic device molding material, for example, an epoxy or epoxy-based material.

One disadvantage of the EMI shielding method described above and illustrated in FIG. 2 is that although EMI interference between adjacent packaged devices or modules may be suppressed or eliminated, the possibility still exists for electromagnetic interference or cross-talk to occur between different discreet components within the packaged module. A further embodiment, which may at least partially address this problem, includes incorporating an EMI absorber material into molding compound that is deposited on a device or module. The molding compound may be the same or similar type of molding compound that is typically used to seal and protect a packaged device or module, for example, epoxy or an epoxy-based material, but with the addition of the EMI absorber material. Particles or a powder of the EMI absorber material, which may be or may include one or more of the magnetic ceramic ferrites or iron containing alloys discussed above may be mixed or blended into a typical packaged module molding material. The particles may have characteristic dimensions, for example, radii that are at least as large as the skin depth of the material of the particles at a frequency of interest, for example, at a frequency of electromagnetic interference that the device is expected to generate or which the device may be sensitive to. The particles may have characteristic dimensions of between about 10 µm and about 100 µm. The molding material including the EMI absorber material may then be deposited on the device or module using conventional methods, or directly on a die including components to be shielded. The EMI absorber material filler or particles may be non-conductive or conductive with non-conductive coatings to help avoid shorts between exposed leads of the device or module. The molding material including the EMI absorber material may be deposited with a typical thickness for molding materials used in the industry, for example, between 350 µm and 1000 µm. The greater thickness of the molding material including the EMI absorber material as compared to a sputtered film (for example, 3 µm to 20 µm thick) may provide for greater EMI shielding than a sputtered film of EMI absorbing material. The greater thickness of the molding material vs. a sputtered film may also provide for the use of a lesser absorbing and less expensive EMI absorbing material to achieve equivalent EMI suppression performance as a thinner sputtered or sprayed layer of a higher absorbing but more expensive EMI absorbing material. Incorporating the EMI absorbing material into the molding material may also eliminate the need for any special steps to be performed to deposit the EMI absorbing material.

Figure 3:
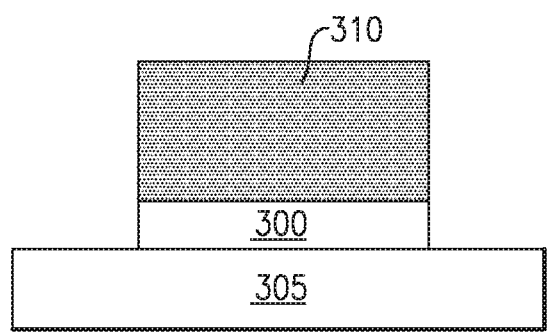
FIG. 3 illustrates an electronic device module including a second type of EMI shielding.

FIG. 3 schematically illustrates an electronic device, for example, a multi-chip module 300 disposed on a circuit board 305, covered by a molding material 310 including EMI absorbing material.

Figure 4:
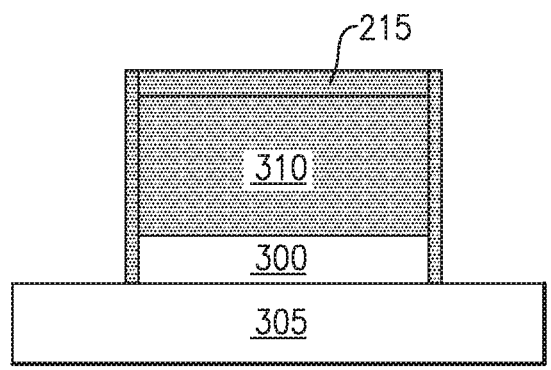
FIG. 4 illustrates an electronic device module including a combination of the first type of EMI shielding and the second type of EMI shielding.

It should be appreciated that the embodiment illustrated in FIG. 2 may be combined with that illustrated in FIG. 3. For example, the molding material 210 of FIG. 2 may include EMI shielding material, resulting in the structure illustrated in FIG. 4.

Figure 5:
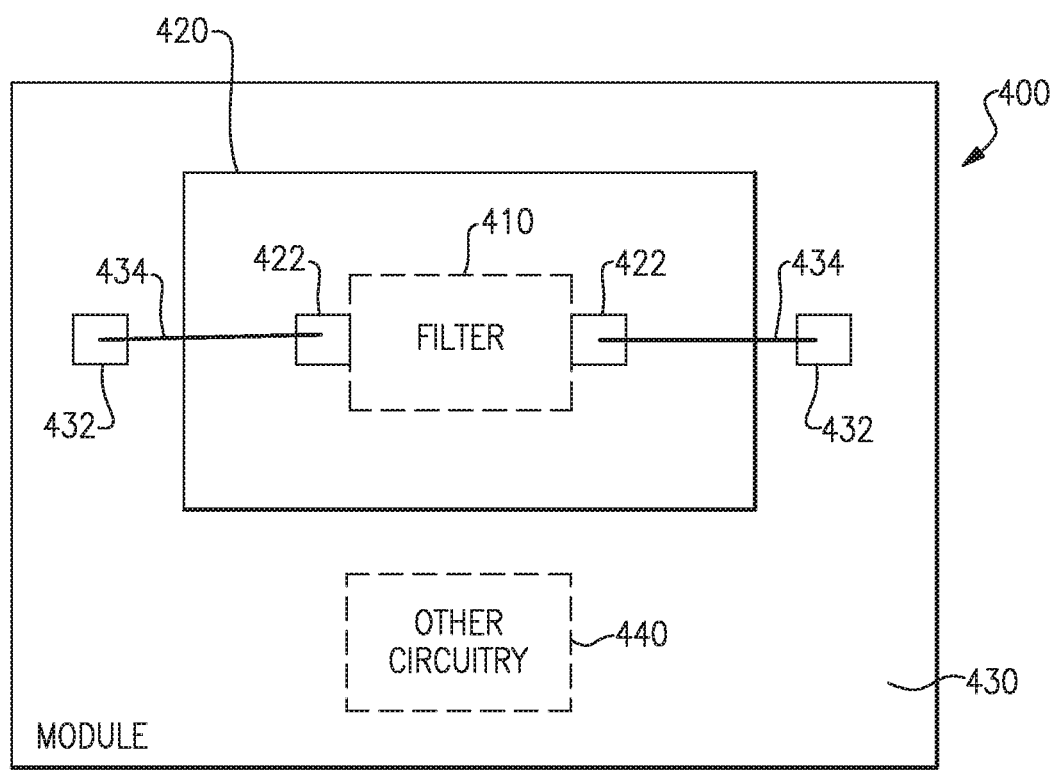
FIG. 5 is a block diagram of one example of a filter module that can include one or more devices according to aspects of the present disclosure.
Figure 6:
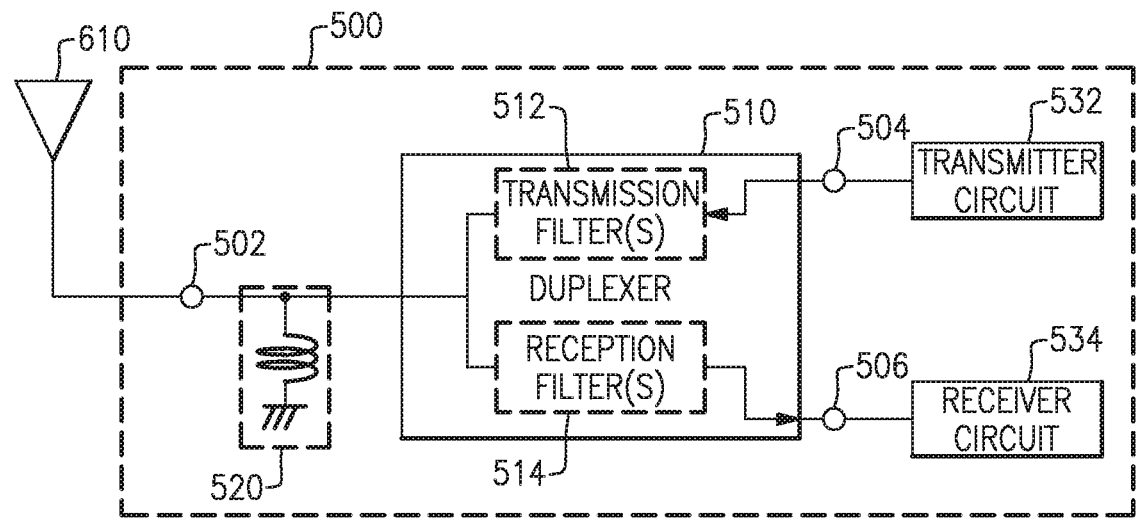
FIG. 6 is a block diagram of one example of a front-end module that can include one or more devices according to aspects of the present disclosure.
Figure 7:
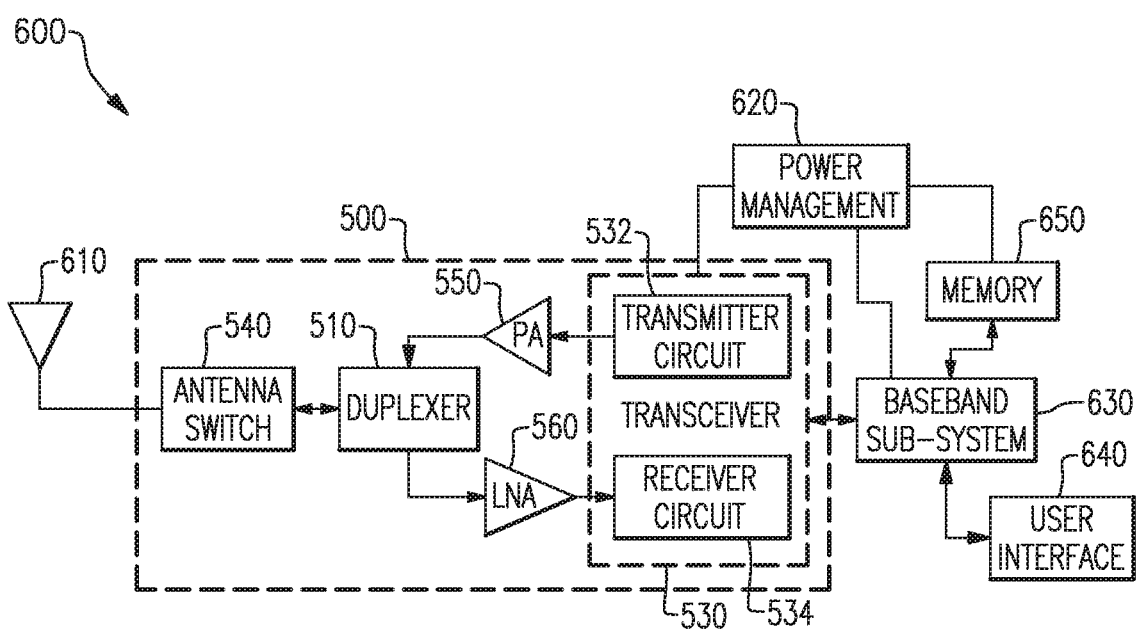
FIG. 7 is a block diagram of one example of a wireless device including the front-end module of FIG. 6.

The devices discussed herein can be implemented in a variety of packaged modules. Some example packaged modules will now be discussed in which any suitable principles and advantages of the devices discussed herein can be implemented. FIGS. 5, 6, and 7 are schematic block diagrams of illustrative packaged modules and devices according to certain embodiments.

Embodiments of the devices disclosed herein may include, for example, filters. In turn, a filter using one or more of the devices disclosed herein may be incorporated into and packaged as a module that may ultimately be used in an electronic device, such as a wireless communications device, for example. FIG. 5 is a block diagram illustrating one example of a module 400 including a filter 410. The filter 410 may be implemented on one or more die(s) 420 including one or more connection pads 422. For example, the filter 410 may include a connection pad 422 that corresponds to an input contact for the filter and another connection pad 422 that corresponds to an output contact for the filter. The packaged module 400 includes a packaging substrate 430 that is configured to receive a plurality of components, including the die 420. A plurality of connection pads 432 can be disposed on the packaging substrate 430, and the various connection pads 422 of the filter die 420 can be connected to the connection pads 432 on the packaging substrate 430 via electrical connectors 434, which can be solder bumps or wirebonds, for example, to allow for passing of various signals to and from the filter 410. The module 400 may optionally further include other circuitry die 440, such as, for example one or more additional filter(s), amplifiers, pre-filters, modulators, demodulators, down converters, and the like, as would be known to one of skill in the art of semiconductor fabrication in view of the disclosure herein. In some embodiments, the module 400 can also include one or more packaging structures to, for example, provide protection and facilitate easier handling of the module 400. Such a packaging structure can include an overmold formed over the packaging substrate 430 and dimensioned to substantially encapsulate the various circuits and components thereon. The overmold may include a filler including examples of the EMI absorbing materials disclosed herein.

Various examples and embodiments of the filter 410 can be used in a wide variety of electronic devices. For example, the filter 410 can be used in an antenna duplexer, which itself can be incorporated into a variety of electronic devices, such as RF front-end modules and communication devices.

Referring to FIG. 6, there is illustrated a block diagram of one example of a front-end module 500, which may be used in an electronic device such as a wireless communications device (e.g., a mobile phone) for example. The front-end module 500 includes an antenna duplexer 510 having a common node 502, an input node 504, and an output node 506. An antenna 610 is connected to the common node 502.

The antenna duplexer 510 may include one or more transmission filters 512 connected between the input node 504 and the common node 502, and one or more reception filters 514 connected between the common node 502 and the output node 506. The passband(s) of the transmission filter(s) are different from the passband(s) of the reception filters. Examples of the filter 410 can be used to form the transmission filter(s) 512 and/or the reception filter(s) 514. An inductor or other matching component 520 may be connected at the common node 502.

The front-end module 500 further includes a transmitter circuit 532 connected to the input node 504 of the duplexer 510 and a receiver circuit 534 connected to the output node 506 of the duplexer 510. The transmitter circuit 532 can generate signals for transmission via the antenna 610, and the receiver circuit 534 can receive and process signals received via the antenna 610. In some embodiments, the receiver and transmitter circuits are implemented as separate components, as shown in FIG. 6, however in other embodiments these components may be integrated into a common transceiver circuit or module. As will be appreciated by those skilled in the art, the front-end module 500 may include other components that are not illustrated in FIG. 6 including, but not limited to, switches, electromagnetic couplers, amplifiers, processors, and the like.

FIG. 7 is a block diagram of one example of a wireless device 600 including the antenna duplexer 510 shown in FIG. 6. The wireless device 600 can be a cellular phone, smart phone, tablet, modem, communication network or any other portable or non-portable device configured for voice or data communication. The wireless device 600 can receive and transmit signals from the antenna 610. The wireless device includes an embodiment of a front-end module 500 similar to that discussed above with reference to FIG. 6. The front-end module 500 includes the duplexer 510, as discussed above. In the example shown in FIG. 7 the front-end module 500 further includes an antenna switch 540, which can be configured to switch between different frequency bands or modes, such as transmit and receive modes, for example. In the example illustrated in FIG. 7, the antenna switch 540 is positioned between the duplexer 510 and the antenna 610; however, in other examples the duplexer 510 can be positioned between the antenna switch 540 and the antenna 610. In other examples the antenna switch 540 and the duplexer 510 can be integrated into a single component.

The front-end module 500 includes a transceiver 530 that is configured to generate signals for transmission or to process received signals. The transceiver 530 can include the transmitter circuit 532, which can be connected to the input node 504 of the duplexer 510, and the receiver circuit 534, which can be connected to the output node 506 of the duplexer 510, as shown in the example of FIG. 6.

Signals generated for transmission by the transmitter circuit 532 are received by a power amplifier (PA) module 550, which amplifies the generated signals from the transceiver 530. The power amplifier module 550 can include one or more power amplifiers. The power amplifier module 550 can be used to amplify a wide variety of RF or other frequency-band transmission signals. For example, the power amplifier module 550 can receive an enable signal that can be used to pulse the output of the power amplifier to aid in transmitting a wireless local area network (WLAN) signal or any other suitable pulsed signal. The power amplifier module 550 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 550 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 7, the front-end module 500 may further include a low noise amplifier module 560, which amplifies received signals from the antenna 610 and provides the amplified signals to the receiver circuit 534 of the transceiver 530.

The wireless device 600 of FIG. 7 further includes a power management sub-system 620 that is connected to the transceiver 530 and manages the power for the operation of the wireless device 600. The power management system 620 can also control the operation of a baseband sub-system 630 and various other components of the wireless device 600. The power management system 620 can include, or can be connected to, a battery (not shown) that supplies power for the various components of the wireless device 600. The power management system 620 can further include one or more processors or controllers that can control the transmission of signals, for example. In one embodiment, the baseband sub-system 630 is connected to a user interface 640 to facilitate various input and output of voice and/or data provided to and received from the user. The baseband sub-system 630 can also be connected to memory 650 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An electronic device comprising an electromagnetic interference shield including a layer of conductive material covering at least a portion of the electronic device and having a skin depth of less than 2 μm for electromagnetic signals having frequencies in a kilohertz range, the electronic device being covered in a molding material and the electromagnetic interference shield being disposed on the molding material.

2. The electronic device of claim 1 wherein the molding material includes a filler material that retards propagation of electromagnetic signals.

3. The electronic device of claim 2 wherein the filler material has a skin depth of less than 2 μm for electromagnetic signals having frequencies in the kilohertz range.

4. The electronic device of claim 2 wherein the filler material includes a magnetic ceramic ferrite.

5. The electronic device of claim 2 wherein the filler material includes an iron containing alloy.

6. The electronics device of claim 2 wherein the filler material is non-conductive.

7. The electronics device of claim 2 wherein the filler material includes conductive particles surrounded by non-conductive material.

8. The electronic device of claim 1 wherein a component of the electronic device is configured to emit an electromagnetic signal at a frequency within one or more of a hertz range, a kilohertz range, or a megahertz range.

9. The electronic device of claim 1 wherein the layer of conductive material includes a magnetic ceramic ferrite.

10. The electronic device of claim 1 wherein the layer of conductive material includes an iron containing alloy.

11. The electronic device of claim 1 wherein the layer of conductive material has a thickness of less than 30 μm.

12. The electronic device of claim 11 wherein the layer of conductive material has a thickness of less than 20 μm.

13. The electronic device of claim 1 further comprising a radio frequency filter.

14. An electronics module including the electronic device of claim 13.

15. An electronic device comprising a molding material covering at least a portion of the electronic device and including a filler material having a skin depth of less than 2 μm for electromagnetic signals having frequencies in a kilohertz range.

16. The electronic device of claim 15 wherein the filler material includes a magnetic ceramic ferrite.

17. The electronic device of claim 15 wherein the filler material includes an iron containing alloy.

18. The electronics device of claim 15 wherein the filler material is non-conductive.

19. The electronics device of claim 15 wherein the filler material includes conductive particles covered by non-conductive material.

20. The electronic device of claim 15 wherein a component of the electronic device is configured to emit an electromagnetic signal at a frequency within one or more of a hertz range, a kilohertz range, or a megahertz range.

21. The electronic device of claim 15 further comprising an electromagnetic interference shield including a layer of conductive material having a skin depth of less than 2 μm for electromagnetic signals having frequencies in a kilohertz range disposed on the molding material.

22. The electronic device of claim 21 wherein the layer of conductive material includes a magnetic ceramic ferrite.

23. The electronic device of claim 21 wherein the layer of conductive material includes an iron containing alloy.

24. The electronic device of claim 21 wherein the layer of conductive material has a thickness of less than 30 μm.

25. The electronic device of claim 24 wherein the layer of conductive material has a thickness of less than 20 μm.

26. The electronic device of claim 15 further comprising a radio frequency filter.

27. An electronics module including the electronic device of claim 26.

28. A method of forming an electromagnetic interference shield on an electronic device, the method comprising depositing a molding material including a filler material having a skin depth of less than 2 μm for electromagnetic signals having frequencies in a kilohertz range on a surface of the electronic device.

29. The method of claim 28 further comprising depositing a layer of conductive material having a skin depth of less than 2 µm for electromagnetic signals having frequencies in the kilohertz range on the molding material.

30. A method of forming an electromagnetic interference shield on an electronic device, the method comprising:
depositing a molding material on a surface of the electronic device, the molding material covering at least a portion of the electronic device and including a filler material having a skin depth of less than 2 µm for electromagnetic signals having frequencies in a kilohertz range; and
depositing a layer of conductive material having a skin depth of less than 2 µm for electromagnetic signals having frequencies in a kilohertz range on the molding material.

31. An electronic device comprising an electromagnetic interference shield including a layer of conductive material including a magnetic ceramic ferrite covering at least a portion of the electronic device and having a skin depth of less than 2 µm for electromagnetic signals having frequencies in a kilohertz range.

32. The electronic device of claim 31 wherein the electronic device is covered in a molding material and the electromagnetic interference shield is disposed on the molding material.

33. An electronic device comprising an electromagnetic interference shield including a layer of conductive material covering at least a portion of the electronic device and having a skin depth of less than 2 µm for electromagnetic signals having frequencies in a kilohertz range, the electronic device further comprising a radio frequency filter.

* * * * *

UNITED STATES PATENT AND TRADEMARK OFFICE
CERTIFICATE OF CORRECTION

PATENT NO.         : 11,190,158 B2
APPLICATION NO.    : 16/576945
DATED              : November 30, 2021
INVENTOR(S)        : Dinhphuoc Vu Hoang et al.

Page 1 of 1

It is certified that error appears in the above-identified patent and that said Letters Patent is hereby corrected as shown below:

In the Specification

Column 4, Line 49, delete "MCFS" and insert -- MCF5 --.

Column 5, Line 4, delete "MCFS" and insert -- MCF5 --.

Column 5, Line 8, delete "MCFS" and insert -- MCF5 --.

Signed and Sealed this
Fourth Day of January, 2022

Drew Hirshfeld
*Performing the Functions and Duties of the*
*Under Secretary of Commerce for Intellectual Property and*
*Director of the United States Patent and Trademark Office*